(12) United States Patent
Wakaki et al.

(10) Patent No.: US 9,698,312 B2
(45) Date of Patent: Jul. 4, 2017

(54) RESIN PACKAGE AND LIGHT EMITTING DEVICE

(71) Applicant: NICHIA CORPORATION, Anan-shi (JP)

(72) Inventors: Ryosuke Wakaki, Tokushima (JP); Morito Kanada, Santa Clara, CA (US)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/572,779

(22) Filed: Dec. 17, 2014

(65) Prior Publication Data

US 2015/0171282 A1    Jun. 18, 2015

(30) Foreign Application Priority Data

Dec. 17, 2013 (JP) .................. 2013-260657

(51) Int. Cl.
  *H01L 33/48*    (2010.01)
  *H01L 33/62*    (2010.01)
  *H01L 33/54*    (2010.01)

(52) U.S. Cl.
  CPC ............ *H01L 33/486* (2013.01); *H01L 33/54* (2013.01); *H01L 33/62* (2013.01); *H01L 2224/48091* (2013.01); *H01L 2224/48247* (2013.01); *H01L 2224/49107* (2013.01)

(58) Field of Classification Search
  CPC ........ H01L 33/486; H01L 33/54; H01L 33/62
  See application file for complete search history.

(56) References Cited

U.S. PATENT DOCUMENTS

| 6,809,342 | B2 * | 10/2004 | Harada | H01L 33/44 257/79 |
| 6,900,511 | B2 * | 5/2005 | Ruhnau | H01L 31/0203 257/432 |
| 2002/0085390 | A1 * | 7/2002 | Kiyomoto | B60Q 1/302 362/555 |
| 2004/0089898 | A1 * | 5/2004 | Ruhnau | H01L 31/0203 257/343 |
| 2005/0263786 | A1 | 12/2005 | Isoda | |
| 2010/0314654 | A1 | 12/2010 | Hayashi | |

(Continued)

FOREIGN PATENT DOCUMENTS

| JP | 2005-039193 | 2/2005 |
| JP | 2005-109382 | 4/2005 |

(Continued)

*Primary Examiner* — Bilkis Jahan
*Assistant Examiner* — Victor Barzykin
(74) *Attorney, Agent, or Firm* — Mori & Ward, LLP (57) ABSTRACT

A resin package includes a molded resin housing, a first lead, and a second lead. The molded resin housing includes a cavity open upward. The cavity includes an inner surface. The inner surface includes a curved portion and a stepped portion provided on a lower side of the curved portion. The first lead and the second lead are provided in a bottom portion of the cavity such that at least a part of the first lead and the second lead is exposed from the molded resin housing. The first lead includes an elevated portion on which a light emitting element is mounted. An upper surface of the elevated portion is provided higher than an upper end portion of the stepped portion.

23 Claims, 5 Drawing Sheets

(56) References Cited

U.S. PATENT DOCUMENTS

| | | | |
|---|---|---|---|
| 2011/0198618 A1* | 8/2011 | Jeong | H01L 33/42 257/79 |
| 2012/0267661 A1* | 10/2012 | Kim | H01L 33/486 257/98 |
| 2013/0009190 A1* | 1/2013 | Memida | H01L 33/486 257/98 |
| 2013/0092966 A1* | 4/2013 | Jaeger | H01L 33/60 257/98 |
| 2013/0207144 A1* | 8/2013 | Ramchen | H01L 33/52 257/98 |

FOREIGN PATENT DOCUMENTS

| | | |
|---|---|---|
| JP | 2007-173875 | 7/2007 |
| JP | 2008-004640 | 1/2008 |
| JP | 2009-141030 | 6/2009 |
| JP | 2009-170795 | 7/2009 |
| WO | WO 2008/081794 | 7/2008 |

* cited by examiner

BACKGROUND ART

US 9,698,312 B2

RESIN PACKAGE AND LIGHT EMITTING DEVICE

CROSS-REFERENCE TO RELATED APPLICATIONS

The present application claims priority under 35 U. S. C. §119 to Japanese Patent Application No. 2013-260657, filed Dec. 17, 2013. The contents of this application are incorporated herein by reference in their entirety.

BACKGROUND OF THE INVENTION

Field of the Invention

The present invention relates to a resin package and a light emitting device.

Discussion of the Background

A light emitting device has been known that includes an LED chip located on a bottom portion of an opening formed in a casing. In the light emitting device a reflecting surface of the opening is curved, and an element mounting base of a predetermined height is provided on the bottom portion of the casing, for example as disclosed in Japanese Unexamined Patent Application Publication No. 2008-4640.

Figure 9:
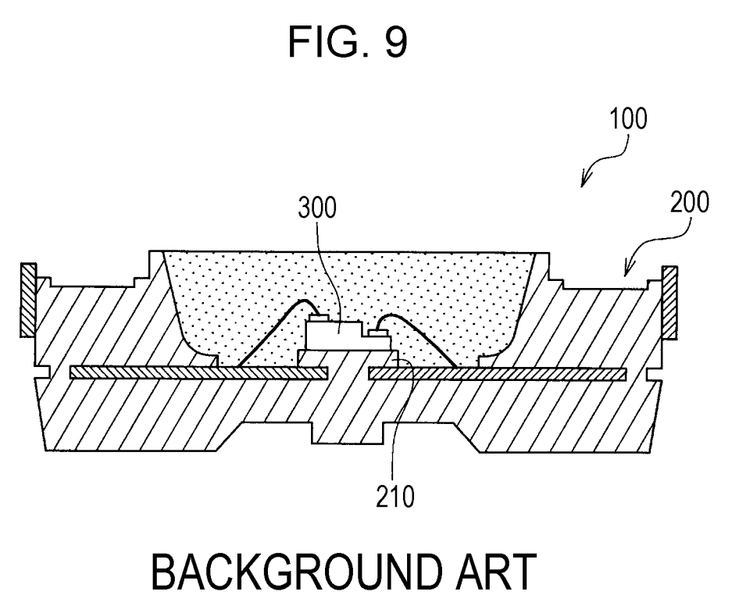
FIG. 9 is a vertical cross-sectional view of a conventional light emitting device.

FIG. 9 is a vertical cross-sectional view of a conventional light emitting device 100 according to Japanese Unexamined Patent Application Publication No. 2008-4640.

In the light emitting device 100 shown in FIG. 9, a light emitting element 300 is mounted on an element mounting base 210 in a reflecting case 200 formed of a resin.

SUMMARY OF THE INVENTION

According to one aspect of the present invention, a resin package includes a molded resin housing, a first lead, and a second lead. The molded resin housing includes a cavity open upward. The cavity includes an inner surface. The inner surface includes a curved portion and a stepped portion provided on a lower side of the curved portion. The first lead and the second lead are provided in a bottom portion of the cavity such that at least a part of the first lead and the second lead is exposed from the molded resin housing. The first lead includes an elevated portion on which a light emitting element is mounted. An upper surface of the elevated portion is provided higher than an upper end portion of the stepped portion.

According to another aspect of the present invention, a light emitting device includes a resin package and a light emitting element. The resin package includes a molded resin housing, a first lead, and a second lead. The molded resin housing includes a cavity open upward. The cavity includes an inner surface. The inner surface includes a curved portion and a stepped portion provided on a lower side of the curved portion. The first lead and the second lead are provided in a bottom portion of the cavity such that at least a part of the first lead and the second lead is exposed from the molded resin housing. The light emitting element is mounted on the first lead and includes a light emitting layer provided higher than an upper end portion of the stepped portion.

According to further aspect of the present invention, a resin package includes a molded resin housing, a first lead, and a second lead. The molded resin housing has a first side and a second side opposite to the first side in a height direction of the molded resin housing. The molded resin housing includes a cavity which has an opening on the first side, a bottom portion, and an inner surface. The inner surface includes a stepped portion and a curved portion. The stepped portion is provided between the first side and the bottom portion. The curved portion extends from the first side toward the stepped portion. The first lead is provided in the molded resin housing and includes an exposed portion exposed from the bottom portion of the cavity. The first lead includes an elevated portion which is provided at the exposed portion and on which a light emitting element is mounted. An upper surface of the elevated portion is provided between an upper end portion of the stepped portion and the first side in the height direction. The second lead is provided in the molded resin housing.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

The embodiments will now be described with reference to the accompanying drawings, wherein like reference numerals designate corresponding or identical elements throughout the various drawings.

Hereafter, a resin package and a light emitting device according to a first embodiment of the present invention will be described, with reference to FIG. 1 to FIG. 4.

The embodiment described below represents a resin package 1 embodying the technical concept of the present disclosure, and is merely an example in no way intended to limit the size, material, shape, and relative positions of the constituents of the embodiment unless otherwise specifically noted. In the drawings, the size, thickness, relative positions and so forth of the constituents may be illustrated in an exaggerated scale, for the sake of clarity of the description.

For the convenience in explaining the embodiment, the side of a molded resin housing 2 on which an encapsulating member 5 is provided will be referred to as upper side, the direction of the longer sides of a top face 2g of the molded resin housing 2 will be referred to as longitudinal direction, and the direction of the shorter sides of the top face 2g will be referred to as width direction.

Resin Package

Figure 1:
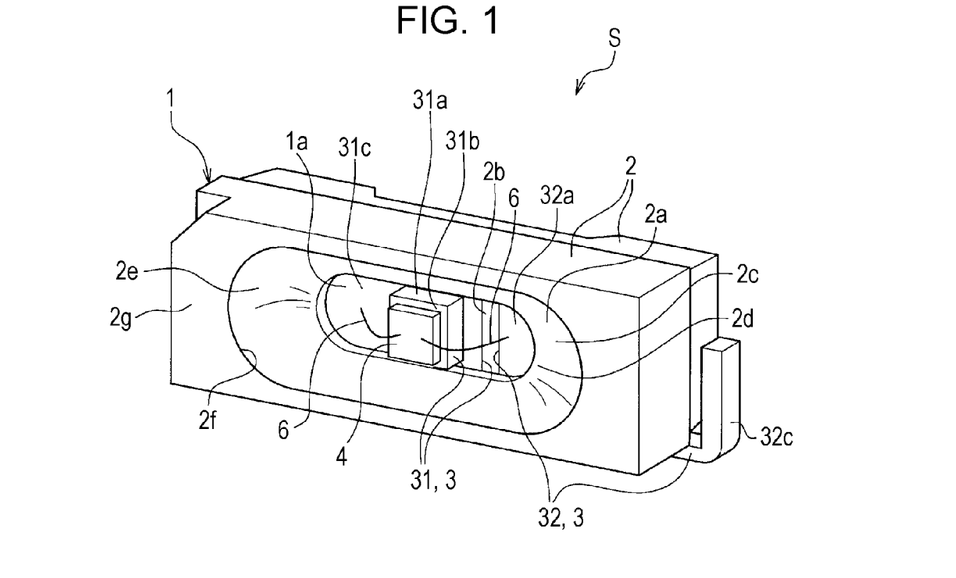
FIG. 1 is a schematic perspective view showing a resin package according to a first embodiment, with a light emitting element mounted thereon.
Figure 2:
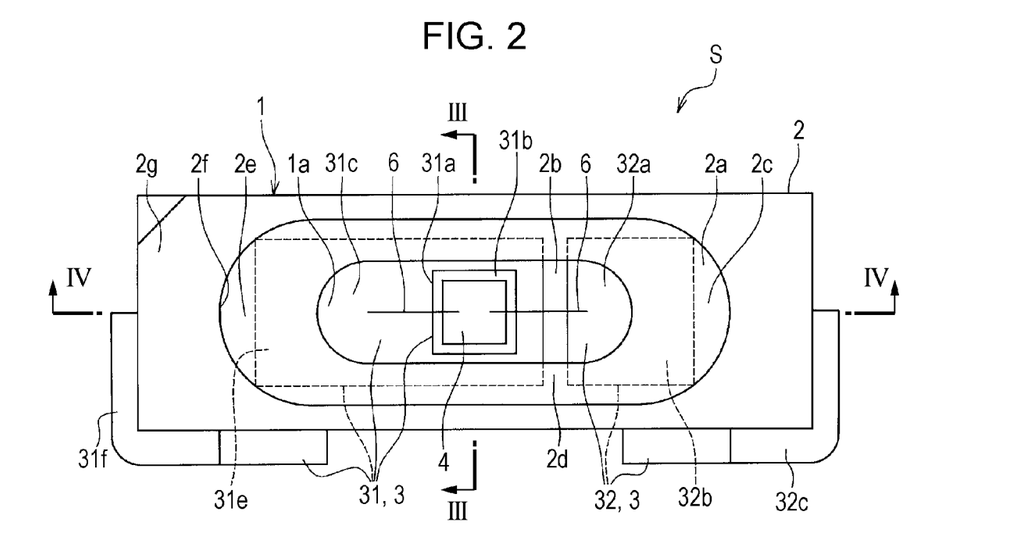
FIG. 2 is a schematic front view showing the resin package according to the first embodiment, with the light emitting element mounted thereon.

As shown in FIG. 1 and FIG. 2, the resin package 1 includes a cavity 2a in which a light emitting element 4 is able to be mounted. A pair of leads 3 including a first lead 31 and a second lead 32 is provided on a bottom portion 1a of the cavity 2a.

Figure 3:
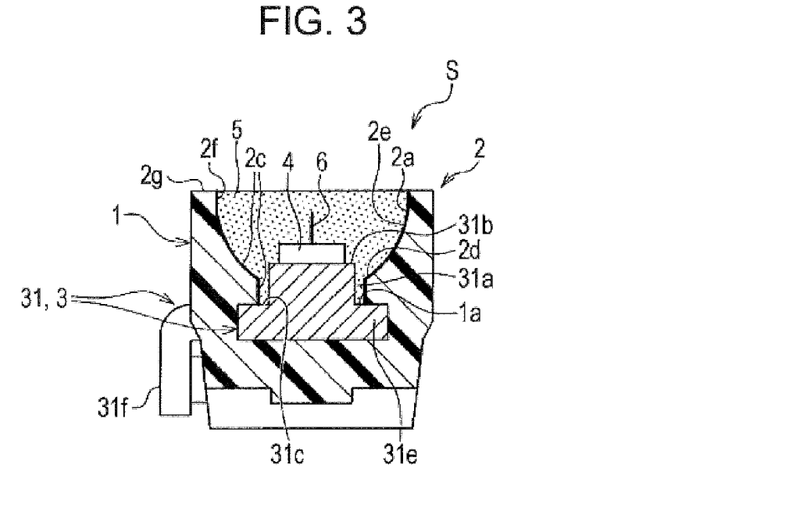
FIG. 3 is a cross-sectional view taken along a line III-III in FIG. 2, showing the light emitting device mounted in the resin package shown in FIG. 1.
Figure 4:
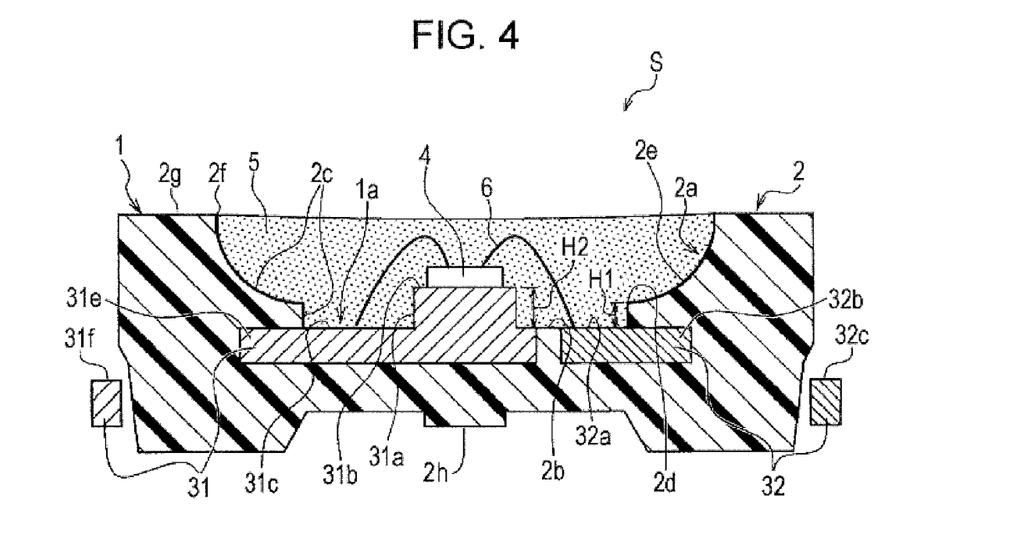
FIG. 4 is a cross-sectional view taken along a line IV-IV in FIG. 2, showing the light emitting device mounted in the resin package shown in FIG. 1.

As shown in FIG. 3 and FIG. 4, an inner surface 2c of the molded resin housing 2 includes a curved portion 2e and a stepped portion (or drop portion) 2d formed on the lower side of the curved portion 2e. The first lead 31 exposed on the bottom portion 1a includes an elevated portion 31a, the upper surface 31b of which serves as an element mounting surface. The upper surface 31b of the elevated portion 31a is located on the upper side with respect to the upper edge of the stepped portion 2d.

Molded Resin Housing

As shown in FIG. 4, the molded resin housing 2 is formed of an insulative resin material into a unified body, so as to enclose therein a part of the first lead 31 and the second lead 32. The molded resin housing 2 has, for example, a rectangular shape in a plan view and a generally cuboid outer shape, and includes the cavity 2a having an opening 2f formed in a central region of the top face 2g. The molded resin housing 2 has a gate trace 2h being an area of the molded resin housing having a thickness greater than a surrounding area, as shown in FIG. 4.

The cavity 2a includes the bottom portion 2b and the inner surface 2c.

The inner surface 2c of the cavity 2a includes the stepped portion 2d defining a level gap upward from the lower circumferential edge of the inner surface 2c, and the curved portion 2e formed of a curved surface extending from the stepped portion 2d to the upper edge of the inner surface 2c.

The stepped portion 2d extends upward from the bottom portion 2b of the cavity 2a by a height H1. In the molded resin housing 2, the upper edge of the stepped portion 2d corresponds to the lower edge of the curved portion 2e. The stepped portion 2d is formed so as to have a linear cross-sectional shape generally perpendicular to the bottom portion 2b of the cavity 2a. In other words, the stepped portion 2d is formed by a mold having a side face that includes a linear portion. Forming the mold having the side face including the linear portion with respect to the surface for holding the leads 3 allows the leads 3 to be firmly retained, thereby preventing the molding resin from intruding between the lead 3 and the mold. Therefore, formation of a mold flash can be suppressed.

The curved portion 2e is a portion of the inner surface 2c extending in the upper region from the stepped portion 2d, and sloped in a curved shape in a cross-sectional view. In the first embodiment, the curved portion 2e corresponds to the sloped surface (curved surface) extending from the upper edge of the stepped portion 2d to the top face 2g of the molded resin housing 2 (upper edge of the inner surface 2c). The curved portion 2e thus configured serves as a reflecting surface that reflects upward the light emitted from the light emitting element 4. The curved portion 2e is formed such that the diameter gradually increases from the stepped portion 2d toward the edge of the opening 2f, in a vertical cross-sectional view.

In the case where the upper edge of the inner surface 2c of the cavity 2a reaches the top face 2g of the molded resin housing 2, the portion of the inner surface 2c in the vicinity of the upper edge thereof may be formed in an orientation generally perpendicular to the top face 2g of the molded resin housing 2. Forming thus the upper end portion of the inner surface 2c of the cavity 2a in a shape closer to linear rather than a curved shape in a vertical cross-sectional view allows the light to be reflected in the upward direction. The mentioned configuration contributes to improving the incident efficiency of the light onto a light guide plate, as well as the appearance of a region around a light entrance. In other words, the inner surface 2c includes an uncurved (linear) portion formed in the upper end portion. Extending the linear portion so as to form the tangential line of the curved portion 2e allows the curved portion 2e and the linear portion to be formed in a natural continuous surfaces with respect to each other. Forming thus the linear portion on the upper side of the upper end portion of the curved portion 2e contributes to improving the incident efficiency of the light onto the light entrance of the light guide plate, as well as the appearance of the region around the light entrance. It is preferable that the lower end of the linear portion (upper end of the curved portion) is located at an upper position with respect to the upper surface of the light emitting element 4, and more preferably, at a position close to the top face 2g of the molded resin housing 2. Such a configuration further improves the incident efficiency of the light onto the light entrance of the light guide plate.

Lead

The leads 3 are lead terminals for electrically connection between the light emitting element 4 and an external power source, and includes at least two leads (first lead 31 and second lead 32) to serve as a positive and negative pair of electrodes.

As shown in FIG. 4, the first lead 31 is a lead terminal for the light emitting element 4 to be mounted thereon and for the electrically connection to the external power source, and formed in the molded resin housing 2 by insert molding. The first lead 31 is formed by bending a generally plate-shaped member and buried in the molded resin housing 2, and includes an inner lead 31e exposed on the bottom portion 1a of the cavity 2a and an outer lead 31f disposed outside of the molded resin housing 2.

The inner lead 31e of the first lead 31 includes a elevated portion 31a and a flat region 31c including a wire region.

The elevated portion 31a is integrally formed on the upper face of the first lead 31, and serves to locate the light emitting element 4 at an upper position with respect to the stepped portion 2d of the molded resin housing 2. The elevated portion 31a is a protrusion of a generally square column shape protruding upward from a flat region including a wire connection region, located in a generally central region of the cavity 2a in a plan view (see FIG. 1).

The upper surface 31b of the elevated portion 31a is the element mounting surface on which the light emitting element 4 is mounted, and constituted of a horizontal surface formed at a highest position of the first lead 31 in the cavity 2a. A height H2 from the base portion of the elevated portion 31a (i.e., flat region 31c) to the upper surface 31b (element mounting base) of the elevated portion 31a is higher than the height H1 of the stepped portion 2d.

The flat region 31c including the wire connection region where an end portion of a wire 6 is connected, the other end portion of the wire 6 being connected to the light emitting element 4, is formed in a flat shape. In the bottom portion 2b of the cavity 2a of the resin package 1, the flat region 31c of the first lead 31 and the second lead 32, and the bottom portion 2b of the molded resin housing 2 are generally flush with each other.

As shown in FIG. 4, the second lead 32 includes, like the first lead 31, an inner lead 32b buried in the molded resin housing 2 and an outer lead 32c disposed outside of the molded resin housing 2.

The inner lead 32b includes a wire connection region 32a where an end portion of another wire 6 is connected, the other end portion of the wire 6 being connected to the light emitting element 4, and the wire connection region 32a is generally flush with the bottom portion 2b of the molded resin housing 2 and the flat region 31c (wire connection region) of the first lead 31.

Light Emitting Device

The light emitting device S includes the resin package 1 including the leads 3, the light emitting element 4 mounted on the elevated portion 31a of the first lead 31, the wire 6 connected to the leads 3, and the encapsulating member 5 filled in the cavity 2a of the molded resin housing 2. The light emitting device S is employed, for example, as a backlighting for liquid crystal display, and a light source of an illuminating apparatus.

Light Emitting Element

The light emitting element 4 is a semiconductor element that emits light, constituted of a gallium nitride-based compound semiconductor, for example. The light emitting element 4 is mounted on the upper surface of the elevated portion 31a of the first lead 31, via a non-illustrated die bonder. The light emitting element 4 is located in a central portion of the cavity 2a in a plan view, and at a position higher than the stepped portion 2d in a cross-sectional view. The light emitting element 4 may be constituted of any material provided that the material is capable of emitting light. The luminance, color, material, shape, number of pieces, and type of the light emitting element 4 are not specifically limited, and a suitable one may be selected according to the intended purpose of use.

Encapsulating Member

The encapsulating member 5 is formed of a light-transmissive insulative material filled in the cavity 2a so as to cover the light emitting element 4 mounted on the upper surface 31b of the elevated portion 31a. The encapsulating member 5 is filled so as to be generally flush with the top face 2g of the molded resin housing 2. The encapsulating member 5 is formed of, for example, a thermosetting resin-based composite material containing a fluorescent material, and serves to adjust the color tone of the light emitting device S. The encapsulating member 5 also serves to protect the light emitting element 4 from an external force, dust, moisture, and so forth, and improve the heat resistance, weather resistance, and light-proofness of the light emitting element 4. Further, the encapsulating member 5 may contain an organic or inorganic coloring dye or coloring pigment to exclude light of an undesired wavelength, or a diffuser or a filler to control light distribution and color unevenness. Examples of the material of the encapsulating member 5 include a weather-resistant transparent resin such as an epoxy resin, a urea resin, a silicone resin, a modified epoxy resin, a modified silicone resin, or polyamide, and glass.

The wire 6 connecting between the light emitting element 4 and the first lead 31 or the second lead 32 is formed of a conductive metal such as Au, Ag, Al, or Cu.

Manufacturing Method of Resin Package

Referring to FIG. 1 to FIG. 4, a manufacturing method of the resin package 1 according to the first embodiment of the present invention will be described hereunder.

First, a lead frame including a portion to be formed into the first lead 31 and the second lead 32 is prepared. Such a lead frame may be obtained by processing a plate-shaped lead frame. To form the plan-view shape, pressing, punching, blasting, or etching may be employed. To form the elevated portion 31a, in other words to form an uneven shape in the vertical direction, the same method as for the plan-view shape may be employed, or an irregular-shaped lead frame on which the elevated portion 31a or a thicker portion including the elevated portion 31a is formed in advance may be employed.

A sheet of lead frame includes a portion to be formed into the first lead 31 and the second lead 32 of the resin package 1, and is treated as a bulk material of the resin packages before being cut into the light emitting device S after undergoing processes such as resin molding, mounting of the light emitting element, and forming of the encapsulating member. For the sake of simplicity, the subsequent description will be focused on a single piece of resin package.

The leads 3 are set between an upper and a lower mold. The upper mold includes a protruding portion corresponding to the cavity 2a of the molded resin housing 2. In addition, the upper mold includes a recessed portion 2a formed on the top face of the protruding portion, corresponding to the elevated portion 31a of the first lead 31.

The side face of the protruding portion of the upper mold is formed in the shape corresponding to the inner surface 2c of the molded resin housing 2, and includes the portions corresponding to the curved portion 2e and the stepped portion 2d. The portion of the protruding portion of the upper mold in the vicinity of the top face thereof is formed in a linear shape in a cross-sectional view, so as to correspond to the stepped portion 2d of the molded resin housing 2. Forming the upper mold in the mentioned shape keeps the curved portion of the upper mold from directly contacting the leads 3, thereby suppressing formation of a gap between the upper mold and the leads 3. Therefore, formation of a mold flash can be prevented. Further, the length of the linear portion of the side face of the protruding portion of the upper mold from the top face thereof (length from the top face of the protruding portion) is shorter than the depth of the recessed portion formed in the top face of the protruding portion of the upper mold (depth from the top face of the protruding portion). Such a configuration allows the upper surface of the elevated portion 31a of the first lead 31 to be located at a higher position in the resin package 1, than the upper edge of the stepped portion 2d of the inner surface 2c of the cavity 2a of the molded resin housing 2.

A molten molding resin is introduced in a cavity defined by the upper and the lower mold and the leads 3, and taken out after being cooled. The bulk material of the resin packages is thus obtained. The resin package 1 obtained as above includes the molded resin housing 2 including the cavity 2a having the opening on the upper face, and the first and second leads 31, 32 exposed on the bottom portion 2b of the cavity 2a. The inner surface 2c of the cavity 2a includes the curved portion 2e and the stepped portion 2d located on the lower side of the curved portion 2e, and the upper surface of the elevated portion 31a of the first lead 31 is located at a higher position than the upper edge of the stepped portion 2d.

Manufacturing Method of Light Emitting Device Having Resin Package

The light emitting element 4 is mounted in the cavity 2a of the resin package 1 (bulk) obtained as above. To be more detailed, the light emitting element 4 is fixed via a non-illustrated die bonder on the upper surface 31b of the elevated portion 31a of the first lead 31 exposed on the bottom portion 2b of the cavity 2a.

Then an end portion of each of the wires 6, 6 is connected to the light emitting element 4, and the other end portion is connected to each of the flat regions (wire connection regions) 31c, 32a. Here, the wire 6 may be first connected to the flat region and thereafter to the light emitting element 4. The encapsulating member 5 is then filled in the cavity 2a. After that, the outer lead 31f is bent along the resin package 1 and cut away from a hanger lead supporting the resin package 1, and thus the light emitting device S is obtained.

In the light emitting device S obtained as above, the light emitting element 4 is located, as shown in FIG. 4, on the upper surface 31b of the elevated portion 31a having the height H2 from the bottom portion 1a of the cavity 2a, which is higher than the height H1 of the stepped portion 2d. Therefore, when the light emitting element 4 emits light, the light from the light emitting element 4 is efficiently reflected upward. Consequently, the light emitting device S can emit the light in the desired direction over a broad range, with improved light emitting efficiency and higher luminosity.

Further, since the light emitting element 4 is mounted on the upper surface 31b of the elevated portion 31a integrally formed with the first lead 31, heat can be efficiently dissipated via the first lead 31.

Second Embodiment

The present invention is not limited to the first embodiment but may be modified in various manners within the technical scope of the present invention, and as a matter of course such modifications are included in the present invention.

Hereunder, a second embodiment of the present invention will be described with reference to FIG. 5 and FIG. 6. The constituents referred to above will be given the same numeral, and the description thereof will not be repeated.

Figure 5:
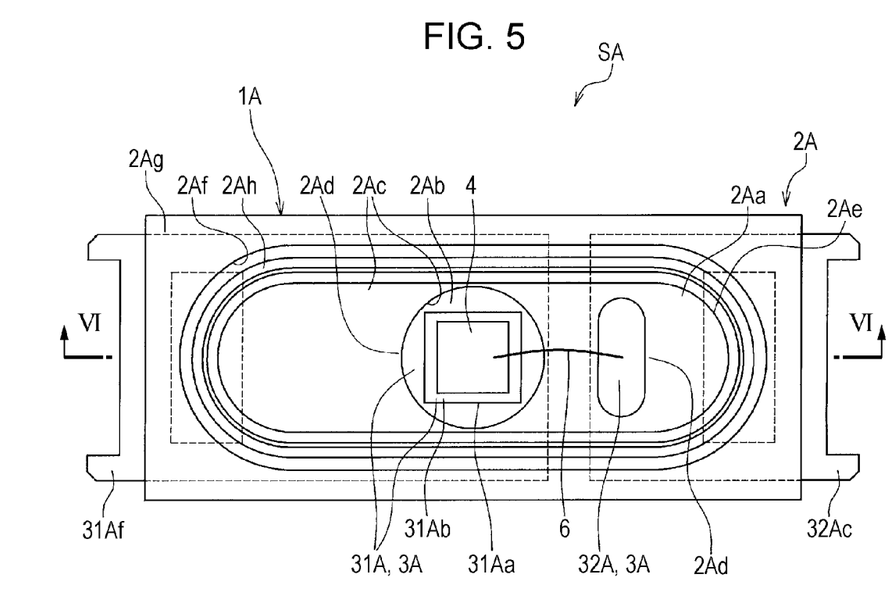
FIG. 5 is a schematic plan view showing a resin package according to a second embodiment, with the light emitting element mounted thereon.

FIG. 5 is a schematic plan view showing a resin package according to the second embodiment, with the light emitting element mounted thereon. FIG. 6 is a cross-sectional view taken along a line VI-VI in FIG. 5, showing the light emitting device mounted in the resin package shown in FIG. 5.

Figure 6:
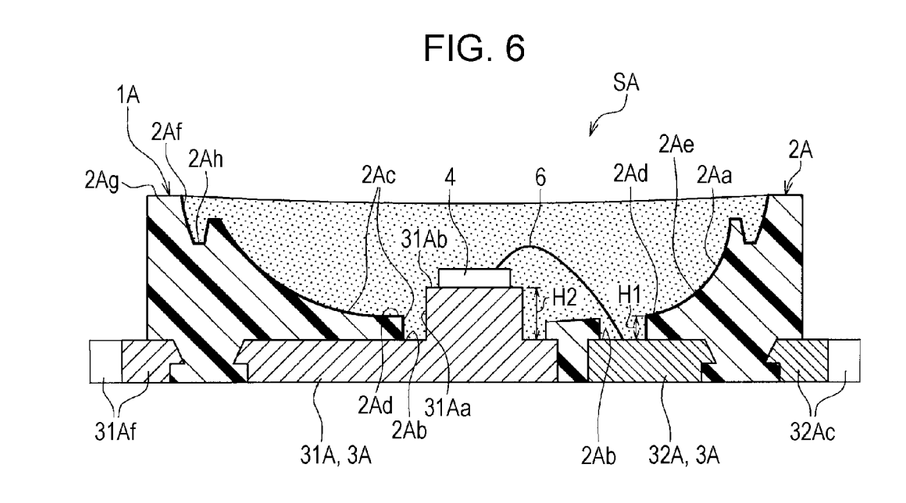
FIG. 6 is a cross-sectional view taken along a line VI-VI in FIG. 5, showing the light emitting device mounted in the resin package shown in FIG. 5.

As shown in FIG. 5 and FIG. 6, a molded resin housing 2A of the resin package 1A includes a bottom portion 2Ab (curved bottom portion) different in height from the upper surface of the first lead 31A around the elevated portion 31Aa and the upper surface of the second lead 32, the bottom portion 2Ab being higher than the upper surfaces of the leads.

As shown in FIG. 6, on the side of the first lead 31A the stepped portion 2Ad of the molded resin housing 2A is located close to the elevated portion of the lead 3A. A portion of the molded resin housing 2A between the first lead 31A and the second lead 32A is formed as an extension from the curved portion 2Ae on the side of the second lead 32A, via the portion where the upper surface of the second lead 32A is exposed. In other words, this portion constitutes a part of the curved portion 2Ae where the end portion on the side of the second lead 32A is higher than the end portion on the side of the first lead 31A.

Thus, the bottom portion 2Ab of the cavity 2Aa is not a flat surface but an uneven surface. FIG. 6 illustrates the curved bottom portion of the molded resin housing 2A including the bottom portion 2Ab of the same height as the upper edge of the stepped portion 2Ad of the inner surface 2Ac of the cavity 2Aa. Alternatively, however, the curved bottom portion of the molded resin housing may be formed at a different height from the upper edge of the stepped portion 2Ad.

Further, the shape of the leads 3A is not specifically limited provided that the element mounting base 31Ab is formed on at least one of the positive and negative pair of leads 3A (first lead 31A and second lead 32A).

Although the outer leads 31f, 32c according to the first embodiment are bent as shown in FIG. 1, the molded resin housing 2A may be formed so as to cover the upper surface of the leads 3A and lower surface of the leads 3A may be exposed without the leads 3A being bent in the bottom face of the molded resin housing 2A, as shown in FIG. 6. Exposing thus the lead 3A in the bottom face of the molded resin housing 2A over a large area improves the heat dissipation efficiency of the resin package 1A and the light emitting device SA. Although the outer leads 31Af, 32Ac stick out from the outer face of the molded resin housing 2A in FIG. 6, the outer leads 31Af, 32Ac may be flush with the outer face of the molded resin housing 2A.

The cavity 2Aa of the molded resin housing 2A may include an additional stepped portion formed in a region of an inner surface 2Ac close to an opening 2Af, at an upper portion of the curved portion 2Ae. In FIG. 6, the additional stepped portion 2Ad is formed so as to form a groove 2Ah in a cross-sectional view.

Third Embodiment

A third embodiment will be described hereunder with reference to FIG. 7. The constituents already referred to above will be given the same numeral, and the description thereof will not be repeated.

Figure 7:
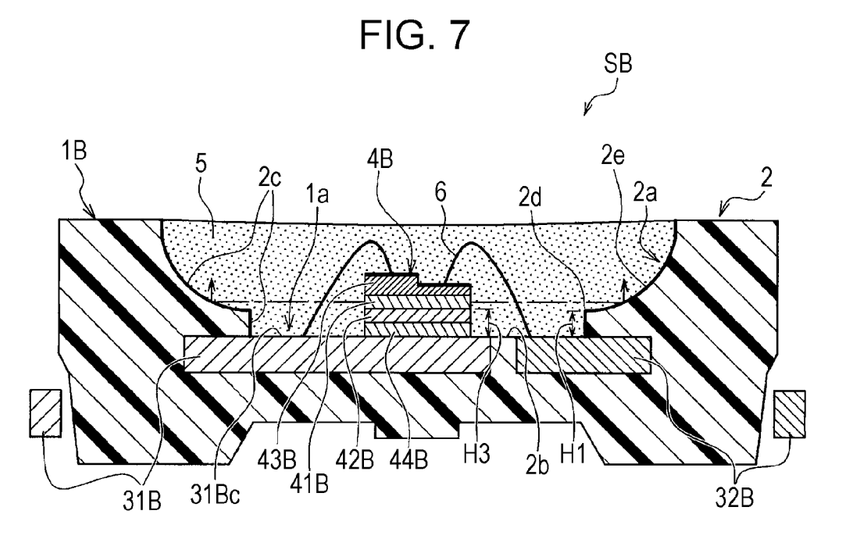
FIG. 7 is a cross-sectional view showing a light emitting device according to a third embodiment.

As shown in FIG. 7, a light emitting device SB includes a resin package 1B including the molded resin housing 2, a first lead 31B, and a second lead 32B, and a light emitting element 4B. The resin package 1B includes the cavity 2a having the inner surface 2c including the curved portion 2e and the stepped portion 2d formed on the lower side of the curved portion 2e, and a light emitting element 4B is mounted on the upper surface 31Bb of the first lead 31B. The light emitting element 4B includes a light emitting layer 41B formed at a height H3 from the bottom portion 1a of the cavity 2a, the height H3 being higher than the height H1 of the upper edge of the stepped portion 2d. The first lead 31B is different from the first lead 31 according to the first embodiment (see FIG. 4) in not including the elevated portion 31a.

The light emitting element 4B configured as above may be obtained by adjusting the thickness of a semiconductor layer 42B and a substrate 44B located on the lower side of the light emitting layer 41B, among the semiconductor layers 42B, 43B and the substrate 44B constituting the light emitting element 4B. In the case where the light emitting layer 41B of the light emitting element 4B is formed of a gallium nitride-based compound semiconductor, the thickness of a growing substrate, for example sapphire or silicon carbonate (SiC), as well as the thickness of an n-type semiconductor layer grown on the substrate, can be increased.

The light emitting element 4B may be composed of substrates bonded together, which are not a growing substrate. For example, the light emitting element may be obtained through preparing a growing substrate on which an n-type semiconductor layer, a light emitting layer (active layer), and a p-type semiconductor layer are formed, bonding another substrate to the p-type semiconductor layer, and separating the growing substrate. In this case, the light emitting layer and the n-type semiconductor layer are located on the p-type semiconductor layer.

Further, the light emitting element may be formed through bonding a still another substrate to the n-type semiconductor layer of the light emitting element having the substrate bonded to the p-type semiconductor layer, and separating the substrate from the p-type semiconductor layer. In this case, the substrate, which is not the growing substrate, is located in the position where the growing substrate has been located. The substrate to be bonded as above may be formed of, for example, a metal such as Cu, W, or a Cu—W alloy, sapphire, or SiC.

Fourth Embodiment

A fourth embodiment will be described hereunder with reference to FIG. 8. The constituents already referred to above will be given the same numeral, and the description thereof will not be repeated.

Figure 8:
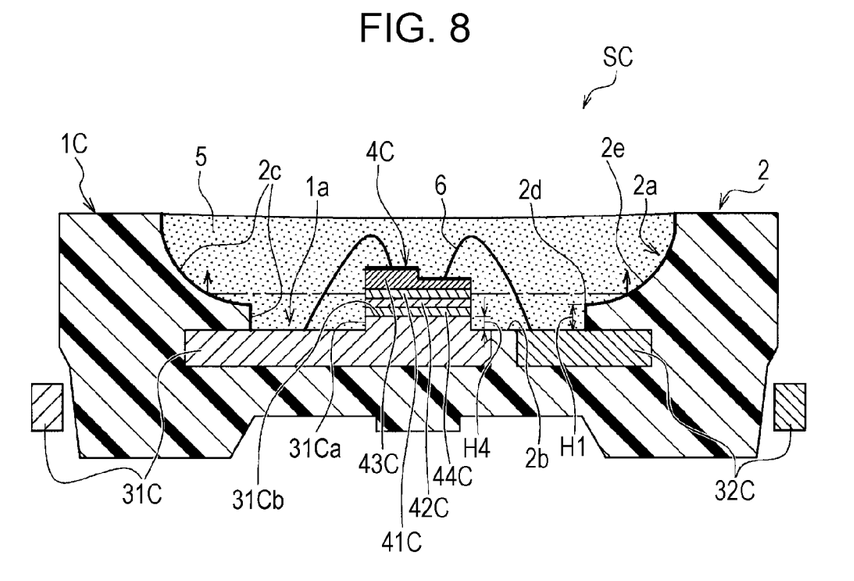
FIG. 8 is a cross-sectional view showing a light emitting device according to a fourth embodiment.

As shown in FIG. 8, a light emitting device SC includes a resin package 1C including the molded resin housing 2, a first lead 31C, and a second lead 32C, and a light emitting element 4C. The resin package 1C includes the cavity 2a having the inner surface 2c including the curved portion 2e and the stepped portion 2d formed on the lower side of the curved portion 2e, and a light emitting element 4C is mounted on the upper surface 31Cb of the first lead 31C. The first lead 31C includes an elevated portion 31Ca, and the light emitting element 4C is mounted on the upper surface 31Cb of the elevated portion 31Ca. The upper surface 31Cb (element mounting base) of the elevated portion 31Ca is located at a height H4 which is lower than the height H1 of the stepped portion 2d, and the light emitting layer 41C of the light emitting element 4C mounted on the upper surface 31Cb of the elevated portion 31Ca is at a higher position than the stepped portion 2d. Although the first lead 31C is the same as the first lead 31 according to the first embodiment (see FIG. 4) in including the elevated portion 31Ca protruding upward from the bottom portion 2b of the cavity 2a, the first lead 31C is different from the first lead 31 according to the first embodiment in that the upper surface 31Cb is located at the lower position from the stepped portion 2d.

The light emitting element 4C according to the fourth embodiment may also be obtained, as in the third embodiment, by adjusting the thickness of a semiconductor layer 42C and a substrate 44C located on the lower side of the light emitting layer 41C, among the semiconductor layers 42C, 43C and the substrate 44C constituting the light emitting element 4C. The light emitting element 4C according to the fourth embodiment may be obtained by reducing the thickness of the layers and the substrate cited above, in comparison with the light emitting element 4B according to the third embodiment (see FIG. 7).

Obviously, numerous modifications and variations of the present invention are possible in light of the above teachings. It is therefore to be understood that within the scope of the appended claims, the invention may be practiced otherwise than as specifically described herein.

What is claimed is:

1. A resin package comprising:
   a molded resin housing including a top face and a cavity open upward in the top face, the cavity including an inner surface comprising:
      a curved portion having a first distal end and a second distal end, a first distance between the first distal end of the curved portion and the top face being smaller than a second distance between the second distal end of the curved portion and the top face; and
      a drop portion connected to the second distal end of the curved portion; and
   a lead provided in a bottom portion of the cavity and including a flat portion having a first thickness upward and an elevated portion having a second thickness upward thicker than the first thickness, the elevated portion of the lead having an upper surface on which a light emitting element is mounted, the drop portion being provided between the second distal end of the curved portion and the flat portion of the lead, the upper surface of the elevated portion being provided higher than the second distal end of the curved portion, the elevated portion being formed integrally with the flat portion,
   wherein the molded resin housing includes a gate trace located under the elevated portion of the lead, the gate trace being an area of the molded resin housing having a thickness greater than a surrounding area.

2. The resin package according to claim 1,
   wherein the lead includes a first lead and a second lead separately provided from the first lead, and
   wherein a part of the molded resin housing provided between the first lead and the second lead is higher than an upper surface of the flat portion of the lead.

3. The resin package according to claim 1,
   wherein the curved portion is substantially perpendicular to the top face at the first distal end of the curved portion.

4. The resin package according to claim 2,
   wherein the curved portion is substantially perpendicular to the top face at the first distal end of the curved portion.

5. The resin package according to claim 1,
   wherein the lead has a thickest thickness at the elevated portion of the lead.

6. The resin package according to claim 1,
   wherein the elevated portion is configured to extend beneath an entirety of the light emitting element.

7. A light emitting device comprising:
   a resin package comprising:
      a molded resin housing including a top face and a cavity open upward in the top face, the cavity including an inner surface comprising:
         a curved portion having a first distal end and a second distal end, a first distance between the first distal end of the curved portion and the top face being smaller a second distance between the second distal end of the curved portion end and the top face; and
         a drop portion connected to the second distal end of the curved portion; and
      a lead provided in a bottom portion of the cavity and including a flat portion having a first thickness upward and an elevated portion having a second thickness upward thicker than the first thickness, the drop portion being provided between the second distal end of the curved portion and the flat portion of the lead, the elevated portion being formed integrally with the flat portion; and
   a light emitting element mounted on the elevated portion of the lead and including a light emitting layer provided higher than the second distal end of the curved portion,
   wherein the molded resin housing includes a gate trace located under the elevated portion of the lead, the gate trace being an area of the molded resin housing having a thickness greater than a surrounding area.

8. The light emitting device according to claim 7, wherein the elevated portion protruding to an upper position with respect to a bottom portion of the cavity, and wherein the elevated portion includes an upper surface on which the light emitting element is mounted.

9. The light emitting device according to claim 8, wherein the upper surface of the elevated portion is provided higher than an upper end portion of the drop portion.

10. The light emitting device according to claim 7, wherein the curved portion is substantially perpendicular to the top face at the first distal end of the curved portion.

11. The light emitting device according to claim 10, wherein the first distal end of the curved portion is provided higher than an upper surface of the light emitting element.

12. The light emitting device according to claim 8, wherein the curved portion is substantially perpendicular to the top face at the first distal end of the curved portion.

13. The light emitting device according to claim 9, wherein the curved portion is substantially perpendicular to the top face at the first distal end of the curved portion.

14. The light emitting device according to claim 12, wherein the first distal end of the curved portion is provided higher than an upper surface of the light emitting element.

15. The light emitting device according to claim 13, wherein the first distal end of the curved portion is provided higher than an upper surface of the light emitting element.

16. The light emitting device according to claim 7, wherein the lead has a thickest thickness at the elevated portion of the lead.

17. The light emitting device according to claim 7, wherein the elevated portion includes an upper surface on which the light emitting element is mounted, wherein the light emitting element includes an element bottom surface, and wherein an entire of the element bottom surface contacts to the upper surface of the elevated portion.

18. The light emitting device according to claim 8, wherein the lead includes a lead bottom surface exposed from a bottom face of the molded resin housing, wherein the lead bottom has a lead bottom part opposite the upper surface of the elevated portion, and wherein the lead bottom part is generally flush with the bottom face of the molded resin housing.

19. The light emitting device according to claim 7, further comprising a wire connected to the flat portion of the lead and the light emitting element.

20. The light emitting device according to claim 7, wherein the elevated portion extends beneath an entirety of the light emitting element.

21. A resin package comprising:

a molded resin housing having a top face and a bottom face opposite to the top face in a height direction of the molded resin housing, the molded resin housing including a cavity which has an opening in the top face, a bottom portion, and an inner surface comprising:

a curved portion having a first distal end and a second distal end, a first distance between the first distal end of the curved portion and the top face being smaller a second distance between the second distal end of the curved portion and the top face; and a drop portion connected to the second distal end of the curved portion; and a lead provided in the molded resin housing and including a flat portion having a first thickness in the height direction and an elevated portion having a second thickness in the height direction thicker than the first thickness, the elevated portion of the lead having an upper surface on which a light emitting element is mounted, the drop portion being provided between the second distal end of the curved portion and the flat portion of the lead, the upper surface of the elevated portion being provided between the second distal end of the curved portion and the top face in the height direction, the elevated portion being formed integrally with the flat portion, wherein the molded resin housing includes a gate trace located under the elevated portion of the lead, the gate trace being an area of the molded resin housing having a thickness greater than a surrounding area.

22. The resin package according to claim 21, wherein the lead has a thickest thickness at the elevated portion of the lead.

23. The resin package according to claim 21, wherein the elevated portion is configured to extend beneath an entirety of the light emitting element.

* * * * *